United States Patent
Hiromatsu et al.

(10) Patent No.: US 9,309,148 B2
(45) Date of Patent: Apr. 12, 2016

(54) METHOD FOR MANUFACTURING GLASS SUBSTRATE WITH LAYERED FILM

(71) Applicant: ASAHI GLASS COMPANY, LIMITED, Chiyoda-ku (JP)

(72) Inventors: Kuniaki Hiromatsu, Tokyo (JP); Masanobu Shirai, Tokyo (JP); Junichi Miyashita, Tokyo (JP); Tomohiro Yonemichi, Tokyo (JP); Takeo Endo, Tokyo (JP)

(73) Assignee: ASAHI GLASS COMPANY, LIMITED, Chiyoda-ku (JP)

(*) Notice: Subject to any disclaimer, the term of this patent is extended or adjusted under 35 U.S.C. 154(b) by 30 days.

(21) Appl. No.: 14/152,078

(22) Filed: Jan. 10, 2014

(65) Prior Publication Data
US 2014/0123704 A1    May 8, 2014

Related U.S. Application Data (63) Continuation of application No. PCT/JP2012/067868, filed on Jul. 12, 2012.

(30) Foreign Application Priority Data

Jul. 12, 2011    (JP) .................. 2011-154316

(51) Int. Cl.
*C03C 17/245* (2006.01)
*C03C 17/00* (2006.01)
(Continued)

(52) U.S. Cl.
CPC ............. *C03C 17/2456* (2013.01); *C03B 25/08* (2013.01); *C03C 17/002* (2013.01); *C23C 16/45572* (2013.01); *C23C 16/45595* (2013.01); *C23C 16/46* (2013.01)

(58) Field of Classification Search
CPC .. C03C 17/2456; C03C 17/002; C03B 25/08; C23C 16/46; C23C 16/45595; C23C 16/45572
See application file for complete search history.

(56) References Cited

U.S. PATENT DOCUMENTS 3,689,304 A    9/1972    Bamford
4,125,391 A    11/1978    Van Laethem
(Continued)

FOREIGN PATENT DOCUMENTS

CN    1501895 A    6/2004
EP    2 377 832    10/2011
(Continued)

OTHER PUBLICATIONS

U.S. Appl. No. 14/152,068, filed Jan. 10, 2014, Hiromatsu, et al.
(Continued)

*Primary Examiner* — Queenie Dehghan
(74) *Attorney, Agent, or Firm* — Oblon, McClelland, Maier & Neustadt, L.L.P.

(57) ABSTRACT

An area S (m²) of a facing surface of each of injectors which faces a glass ribbon is set so as to satisfy: $S \leq (0.0116 \times P \times Cg \times T)/\{\epsilon \times F \times \sigma (T_{gla}^4 - T_{inj}^4)\}$, wherein P is an output (ton/day) of the glass ribbon; Cg is a specific heat (J/(kg·°C.)) of the glass; T is an acceptable temperature drop (°C.); $\epsilon$ is radiation factor; F is a surface-to-surface view factor; $\sigma$ is Boltzmann's constant; $T_{gla}$ is a temperature (K) of the glass ribbon represented by $K = (T_{in} + T_{out})/2$ where $T_{in}$ and $T_{out}$ are measured values of the glass ribbon at the inlet and outlet of the injector, respectively; and $T_{inj}$ is a temperature (K) of the facing surface of the injector.

19 Claims, 3 Drawing Sheets

(51) Int. Cl.
  *C03B 25/08* (2006.01)
  *C23C 16/455* (2006.01)
  *C23C 16/46* (2006.01)

(56) References Cited

U.S. PATENT DOCUMENTS

| | | | |
|---|---|---|---|
| 4,446,815 A * | 5/1984 | Kalbskopf et al. | 118/718 |
| 4,584,206 A | 4/1986 | Sleighter | |
| 4,828,880 A | 5/1989 | Jenkins et al. | |
| 4,900,110 A | 2/1990 | Sleighter | |
| 5,087,525 A | 2/1992 | Goodman et al. | |
| 5,089,039 A | 2/1992 | Terneu et al. | |
| 5,217,753 A | 6/1993 | Goodman et al. | |
| 5,221,352 A | 6/1993 | Terneu et al. | |
| 6,027,766 A * | 2/2000 | Greenberg | C03C 17/245 204/192.12 |
| 2011/0023545 A1 * | 2/2011 | Liu | C03C 17/002 65/60.2 |
| 2011/0259052 A1 * | 10/2011 | Kuhn | 65/30.13 |

FOREIGN PATENT DOCUMENTS

| | | |
|---|---|---|
| GB | 1 307 216 A | 2/1973 |
| JP | 52-124427 | 10/1977 |
| JP | 54-66914 | 5/1979 |
| JP | 61-40844 | 2/1986 |
| JP | 1-201046 | 8/1989 |
| JP | 3-33036 | 2/1991 |
| JP | 3-504120 | 9/1991 |
| JP | 4-35558 | 6/1992 |
| JP | 2001-192234 | 7/2001 |
| WO | 2010/067850 | 6/2010 |

OTHER PUBLICATIONS

U.S. Appl. No. 14/152,056, filed Jan. 10, 2014, Hiromatsu, et al.
International Search Report issued Oct. 23, 2012 in PCT/JP2012/067868 filed Jul. 12, 2012.
Extended European Search Report issued on Feb. 20, 2015 in European Application No. 12811668.8.
Richard J. McCurdy, "Successful implementation methods of atmospheric CVD on a glass manufacturing line", Thin Solid Films, vol. 351, No. 1-2, XP004183068, Aug. 30, 1999, pp. 66-72.

* cited by examiner

METHOD FOR MANUFACTURING GLASS SUBSTRATE WITH LAYERED FILM

TECHNICAL FIELD

The present invention relates to a method for manufacturing a laminated film-coated glass substrate, in particular, a method for manufacturing a laminated film-coated glass substrate in which a laminated film is formed on a glass ribbon in an annealing furnace by an on-line CVD (chemical vapor deposition) method.

BACKGROUND ART

As methods for forming a film on a glass ribbon by an on-line CVD method, for example, the methods described in patent documents 1 to 3 are known.

Patent document 1 discloses a technique in which an oxide containing silicon and oxygen is deposited by a CVD method on a glass ribbon present in a float bath. The document discloses the feature of using an unsaturated hydrocarbon compound and carbon dioxide as an oxygen source in the deposition in order to prevent the molten metal within the float bath from being oxidized by oxygen gas.

Patent document 2 discloses a process in which a silicon dioxide coating film and a tin oxide coating film are successively formed on a glass ribbon by means of a coating station (injector) disposed in a float bath and a coating station disposed in an annealing furnace.

Patent document 3 discloses a process in which a nozzle (injector) is disposed in the region between the outlet of a float bath and the inlet of an annealing furnace to deposit a film on the glass ribbon.

PRIOR ART DOCUMENTS

Patent Documents

Patent Document 1: JP-A-1-201046
Patent Document 2: JP-A-3-33036
Patent Document 3: JP-B-4-35558

SUMMARY OF THE INVENTION

Problems that the Invention is to Solve

In general, a non-oxidizing atmosphere is used as the atmosphere surrounding the molten metal within the float bath in order to prevent the molten metal from being oxidized. Since the glass ribbon within the float bath is in a soft state, the glass ribbon is less apt to suffer warpage or cracking due to a temperature difference in the case where a deposition is conducted by a CVD method on the soft glass ribbon within the float bath.

Patent document 1 discloses the feature of using an unsaturated hydrocarbon compound and carbon dioxide as an oxygen gas source in order to prevent the molten metal within a float bath from being oxidized. This is because: an oxygen gas cannot be used for depositing an oxide in a non-oxidizing atmosphere and because it is therefore necessary to use a reactant gas which contains oxygen molecules. However, in the case where an oxide containing silicon and oxygen is deposited by this method, carbon (C) derived from the hydrocarbon or from the carbon dioxide comes into the oxide film. As a result, the film shows increased absorption and is a film deteriorated in transmittance as compared with carbon-free films.

Consequently, the oxide deposition by a CVD method in float baths has a problem that the film quality is deteriorated, and it is desired to conduct deposition outside the float bath.

Patent document 2 points out that in the case where a coating station is contained in an annealing furnace, the temperature conditions for deposition differ from the temperature conditions for annealing the glass ribbon, thereby posing a problem, and that in the case of forming a multilayer coating, the problem is further complicated. Because of this, patent document 2 recommends that oxygen and a coating precursor which have been premixed with each other should be brought into contact with the surface of the glass ribbon in the float bath. In this method, however, sealing is necessary for confining the oxygen gas, rendering the apparatus complicated.

In addition, in the case where a coating station is contained in the annealing furnace and a metal oxide coating film is formed on the glass ribbon, the glass ribbon is rapidly deprived of heat, as compared with the case where the annealing furnace contains no coating station, due to heat exchange between the glass ribbon and the injector, resulting in a possibility that the glass ribbon might deform or that scratches and cracks might generate. In particular, the larger the number of coating stations, the higher the possibility of generating scratches and cracks. There are cases where the warped glass ribbon comes into contact with the coating station to thereby generate scratches and cracks in the glass.

Patent document 2 hence discloses a problem that in the case where one or more coating stations are contained in the annealing furnace in order to form a multilayer coating, different temperature controls must be established. Despite this, the patent document discloses no specific method of suitable temperature control to be performed in the case where a plurality of coating stations have been disposed in the annealing furnace.

Patent document 3 discloses the feature of disposing a nozzle (injector) in the region between the outlet of a float bath and the inlet of an annealing furnace so as to cover the overall width of the glass. However, even though a conventional float manufacturing apparatus is desired to be utilized without changing, there is not a sufficient space for nozzle disposition between the float bath and the annealing furnace. In addition, since no temperature control of the glass ribbon is being performed in the space between the float bath and the annealing furnace, deposition within the space between the float bath and the annealing furnace poses a problem that the glass ribbon is rapidly deprived of heat because of heat exchange between the nozzle and the glass ribbon.

The present invention has been achieved in view of the problems described above. The present invention provides a method for manufacturing a laminated film-coated glass substrate in which suitable temperature control of a glass ribbon is performed in an on-line CVD method and a laminated film is formed on the glass ribbon using a plurality of injectors disposed in the annealing furnace.

Means for Solving the Problems

The present invention provides the following aspects.

(1) A method for manufacturing a laminated film-coated glass substrate in which a glass manufacturing apparatus comprising a melting furnace capable of melting a raw material for a glass, a float bath capable of floating a molten glass on a molten metal to form a glass ribbon, and an annealing furnace capable of annealing the glass ribbon is used to form a laminated film on the glass ribbon by a CVD method by means of a plurality of injectors disposed in the annealing furnace and the glass ribbon is cut, wherein:

the laminated film is formed at Tg+50° C. or lower, wherein Tg is a glass transition temperature of the glass; and a facing surface of each of the injectors which faces the glass ribbon has an area S (m²) represented by the following expression:

$$S \leq (0.0116 \times P \times Cg \times T)/\{\epsilon \times F \times \sigma(T_{gla}^4 - T_{inj}^4)\}$$

wherein P is an output speed (ton/day) of the glass ribbon; Cg is a specific heat (J/(kg·° C.)) of the glass; T is an acceptable temperature drop (° C.) by which the glass ribbon is cooled during conveyance from an inlet to an outlet in one injector; $\epsilon$ is a radiation factor; F is a view factor in radiative heat transfer between the facing surface of the injector and the glass ribbon; $\sigma$ is Boltzmann's constant ($5.67 \times 10^{-8}$ (W/m²·K⁴)), $T_{gla}$ is a temperature (K) of the glass ribbon represented by $T_{gla} = (T_{in} + T_{out})/2$ using both of a measured value $T_{in}$ obtained by measuring a temperature of the glass ribbon at the inlet of the injector by bringing thermocouple Type K into contact therewith and a measured value $T_{out}$ obtained by measuring a temperature of the glass ribbon at the outlet of the injector by bringing thermocouple Type K into contact therewith; and $T_{inj}$ is a temperature (K) of the facing surface of the injector.

(2) The method for manufacturing a laminated film-coated glass substrate according to (1), wherein a distance between a lower surface of the injector and the glass ribbon is 30 mm or less.

(3) The method for manufacturing a laminated film-coated glass substrate according to (1) or (2), wherein a heater is disposed between the injectors disposed adjacently along a conveying direction of the glass ribbon.

Effects of the Invention

According to the method for manufacturing a laminated film-coated glass substrate of the present invention, a method for manufacturing a laminated film-coated glass substrate has been rendered possible in which suitable temperature control of a glass ribbon is performed in an on-line CVD method and a laminated film is formed on the glass ribbon using a plurality of injectors disposed in the annealing furnace.

MODES FOR CARRYING OUT THE INVENTION

First, one embodiment of glass manufacturing apparatus for use in the method for manufacturing a laminated film-coated glass substrate of the present invention is explained by reference to FIG. 1. In the following explanations, there are cases where the formation of at least one of the layers of a laminated film is called deposition.

Figure 1:
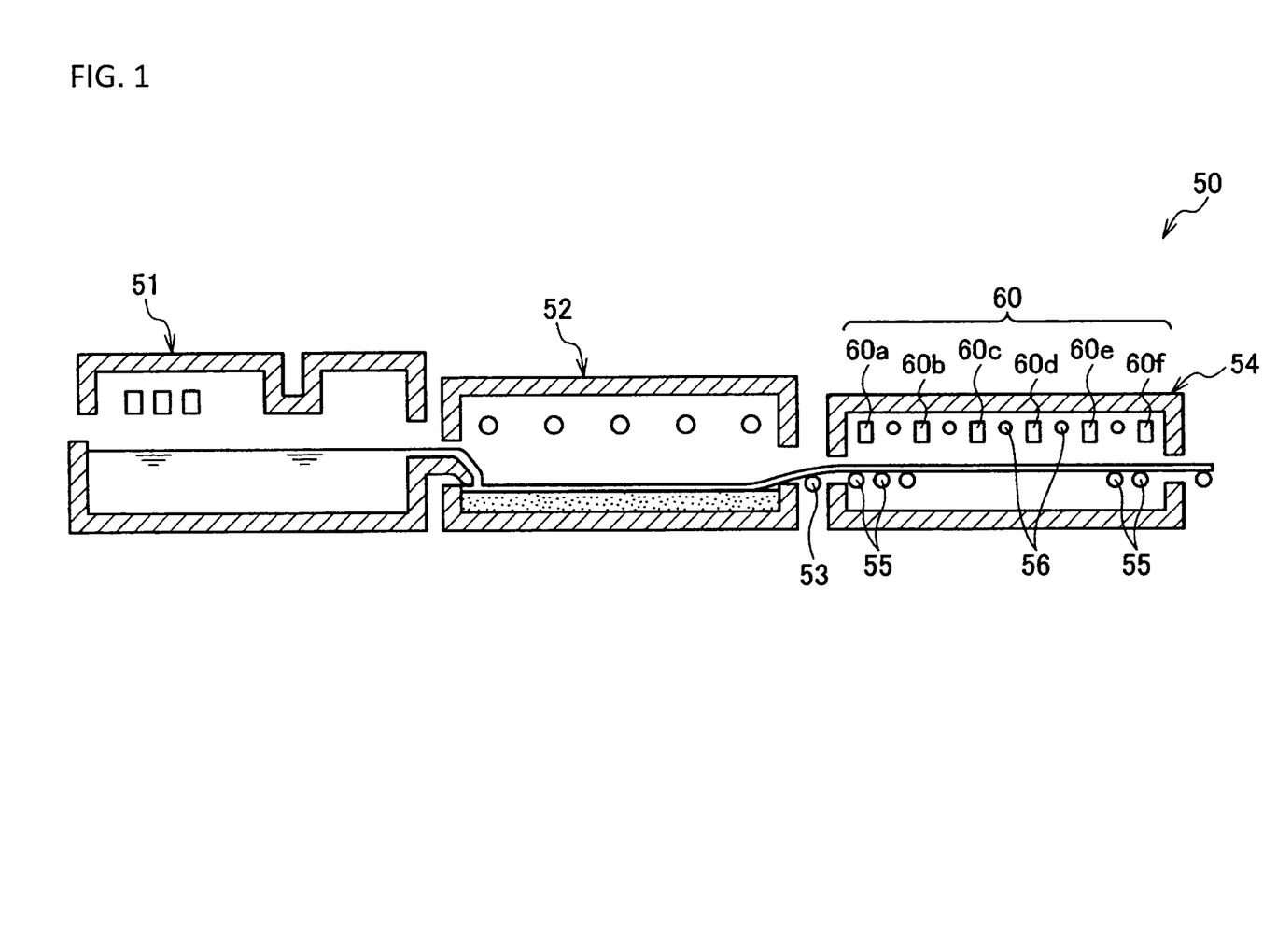
FIG. 1 is a diagrammatic view of a glass manufacturing apparatus.

As shown in FIG. 1, a glass manufacturing apparatus 50 contains a melting furnace 51 capable of melting raw materials for glass, a float bath 52 capable of floating the molten glass obtained by the melting on molten tin to form a flat glass ribbon, and an annealing furnace 54 capable of annealing the glass ribbon by gradually lowering the temperature of the glass ribbon which has been pulled out from the float bath 52 with a lifting-out roll 53.

In the annealing furnace 54, heat is supplied to required positions in the annealing furnace by means of, for example, a combustion gas or an electric heater while controlling the output thereof, and the glass ribbon which is being conveyed with conveying rollers 55 is slowly cooled to a temperature range close to ordinary temperature. The annealing furnace 54 hence has the function of eliminating the residual stress present in the glass ribbon and inhibiting the glass ribbon from warping or cracking. A plurality of injectors 60 are disposed in the annealing furnace 54, and a laminated film is formed on the glass ribbon by a CVD method. The temperature of the glass ribbon at the time when the glass ribbon enters the annealing furnace 54 is frequently around 610° C. (Tg+50° C.) in the case of soda-lime silicate glasses.

The injectors 60 are composed of six injectors 60a to 60f and form a laminated film on the glass ribbon which is being conveyed. Electric heaters 56 have been disposed between the injectors. The number of the injectors 60 is not limited to that number, and is preferably in the range of 2 to 9. The number of the electric heaters also can be increased or reduced according to need. By means of the electric heaters, the temperature of the glass ribbon is prevented from becoming too low during the conveyance from the inlet to the outlet of the annealing furnace. Meanwhile, the heaters disposed between the injectors can heat the glass ribbon present between the position for injectors but do not heat the glass ribbon present under the injectors. Consequently, the disposition of these heaters exerts no influence on the temperature change of the glass ribbon which is cooled during the conveyance from the inlet to the outlet of the injectors.

Figure 2:
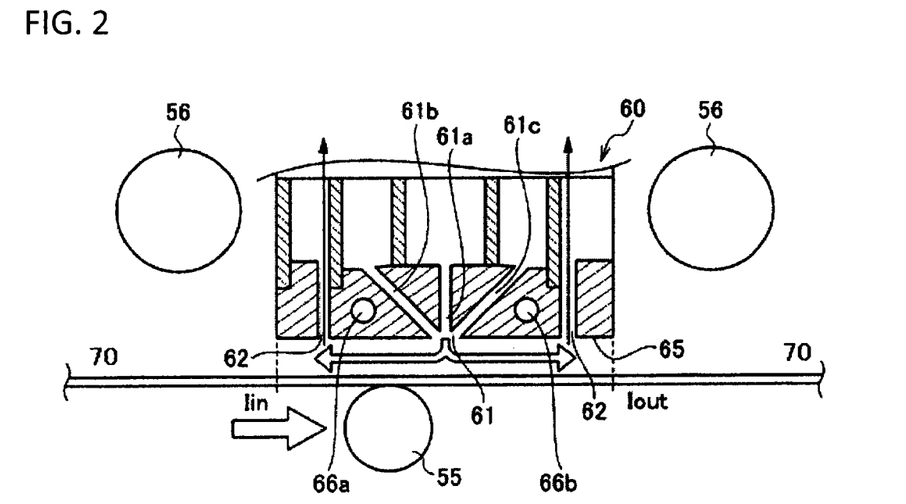
FIG. 2 is a cross-sectional view of an injector.

The injectors 60 (60a to 60f) are disposed on the opposite side of the glass ribbon 70 from the conveying rollers 55, i.e., disposed above the glass ribbon 70, as shown in FIG. 2. Each injector is provided with a inlet slot 61 in substantially the central part of the lower surface 65 thereof, the inlet slot 61 having a slit shape which is elongated in the direction perpendicular to the conveying direction of the glass ribbon, and with an exhaust slot 62 on each of both sides of the inlet slot 61, i.e., before and after the inlet slot 61, each exhaust slot 62 extending parallel with the inlet slot 61.

A first orifice 61a which is located at the center and second and third orifices 61b and 61c which are located respectively on both sides of the first orifice 61a, i.e., before and after the first orifice 61a, are open in the inlet slot 61, the second and third orifices 61b and 61c each having been configured so as to form a channel that is inclined from a raw-material gas supply source toward the first orifice 61a. The width of the inlet slot 61 and exhaust slots 62 is set so as to be equal to or larger than the width of the glass ribbon 70. Signs 66a and 66b denote cooling ducts, through which a cooling medium such as a cooling gas or oil is circulated to keep the injector 60 at an optimal temperature, e.g., 100 to 220° C. (measured on the lower surface of the injector). The lower surface of the injector 60 is a surface which comes into contact with raw-material gases, and in case where the temperature thereof is too high, the raw-material gases which have come into contact with the lower surface of the injector 60 undergo a reaction due to the heat and adhere thereto to deposit an unnecessary film. Because of this, as the upper limit thereof, it is preferably 250° C. or lower. Meanwhile, too low temperatures thereof result in an increased amount of heat exchange with the glass ribbon to cause a rapid temperature drop of the glass ribbon. Consequently, as the lower limit thereof, it is preferably 100° C. or higher.

The injectors 60 are disposed over the glass ribbon 70 at a distance of 3 to 30 mm therefrom. Consequently, the injectors 60 are disposed so that the lower surfaces 65 thereof face the glass ribbon 70 which is being conveyed in the annealing furnace 54, through a space of 3 to 30 mm. Smaller sizes of the space are preferred from the standpoints of film thickness, film quality, and deposition rate during deposition. However, in the case where the size of the space fluctuates due to the warpage or vibration of the glass ribbon, a greater influence is imposed on film thickness and film quality. In the case where the space is large, a decrease in raw-material efficiency during deposition is caused. When the film thickness, film quality, and deposition rate are taken into account, the space is preferably 4 to 12 mm, and more preferably 5 to 10 mm.

Through the first orifice 61a, a gas containing a main raw material for a compound for forming an oxide film is introduced. Through the second and third orifices 61b and 61c, a reactant gas (gas serving as an oxygen source) for forming the oxide film is introduced. Through the exhaust slots 62, the excess gases remaining after the CVD reaction are discharged.

The composition of the glass ribbon can be suitably selected so long as forming by a float process is possible. Examples thereof include soda-lime silicate glasses, aluminosilicate glasses, lithium aluminosilicate glasses, borosilicate glasses, and alkali-free glasses. Of these, soda-lime silicate glasses are preferred from the standpoint that soda-lime silicate glasses are colorless and transparent, are inexpensive, and are easily available on the market in specified forms with respect to area, shape, plate thickness, etc.

The thickness of the glass ribbon can be suitably selected, and it is preferred that the glass thickness should be 0.1 to 6.0 mm. Thin glasses are less apt to have a temperature difference between the front and the back and are hence less prone to warp toward the injector side. However, since the glasses themselves are lightweight, the glass which has once warped toward the injector side does not recover from the warpage even with the aid of its own weight. Meanwhile, thick glasses are prone to have a temperature difference between the front and the back. However, force which reduces warpage is exerted thereon because of their own weight. Consequently, even when the glass thickness varies from 0.1 mm to 6.0 mm, the amount of warpage itself does not change considerably.

The kind, configuration, or the like of the laminated film to be deposited are not particularly limited, and can be suitably selected. The following explanation is given using examples in which a transparent conductive film for solar cells is formed. Examples of applications other than transparent conductive films for solar cells include antireflection films, heat-reflecting films and the like.

Figure 3:
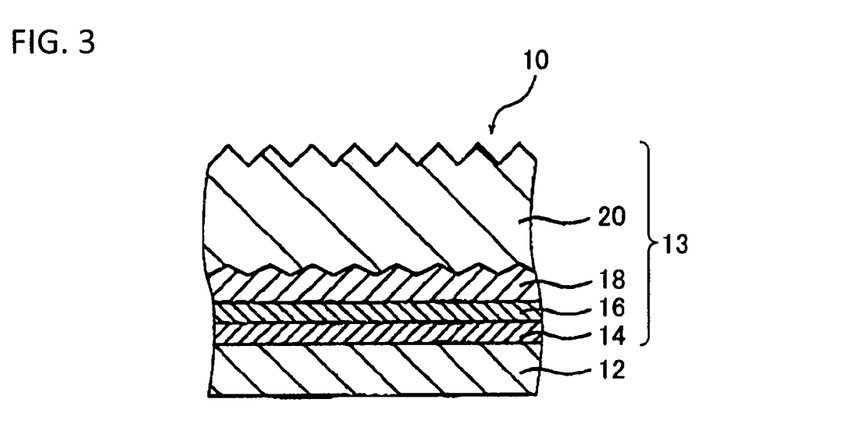
FIG. 3 is a cross-sectional view of one embodiment of a transparent conductive substrate for solar cells which is produced by the method for manufacturing a laminated film-coated glass substrate of the present invention.

FIG. 3 is a cross-sectional view of one embodiment of a transparent conductive substrate for solar cells which is produced by the method for manufacturing a laminated film-coated glass substrate of the present invention. The transparent conductive substrate for solar cells is shown so that the light incidence-side surface thereof is located on the lower side in FIG. 3.

As shown in FIG. 3, the transparent conductive substrate 10 for solar cells includes, on/above a substrate 12, a titanium oxide layer 14, a silicon oxide layer 16, a first tin oxide layer 18, and a second tin oxide layer 20, as a laminated film 13, in this order from the substrate 12 side.

The material of the substrate 12 is not particularly limited, and examples thereof include soda-lime silicate glasses, aluminosilicate glasses, lithium aluminosilicate glasses, borosilicate glasses, and alkali-free glasses. Of these, soda-lime silicate glasses are preferred from the standpoint that soda-lime silicate glasses are colorless and transparent, are inexpensive, and are easily available on the market in specified forms with respect to area, shape, plate thickness, etc.

It is preferred that the thickness of the substrate 12 should be 0.2 to 6.0 mm. The substrate 12 having a thickness within this range has an excellent balance between mechanical strength and light-transmitting properties.

In FIG. 3, a titanium oxide layer 14 has been formed on the substrate 12. In the present invention, the embodiment which has a titanium oxide layer 14 between the substrate 12 and the silicon oxide layer 16 is one of suitable embodiments because the reflection which is caused at the interface between the substrate 12 and the tin oxide layers 18 and 20 by a difference in refractive index between the substrate 12 and the tin oxide layers 18 and 20 can be inhibited.

In order to form the laminated film 13 of this transparent conductive substrate 10 for solar cells by a CVD method in the annealing furnace 54 of the glass manufacturing apparatus 50 shown in FIG. 1, a titanium oxide layer 14 is formed on a glass ribbon, for example, with the first injector 60a, a silicon oxide layer 16 is formed with the second injector 60b, a first tin oxide layer 18 is formed with the third injector 60c, and a second tin oxide layer 20 is formed with the fourth to the sixth injectors 60d to 60f.

In this case, at the inlet slot 61 of the first injector 60a, vaporized tetraisopropoxytitanium is blown from the first orifice 61a and nitrogen gas is blown from the second and third orifices 61b and 61c. As a result, the tetraisopropoxytitanium undergoes a pyrolysis reaction on the glass ribbon to form a titanium oxide layer 14 on the surface of the glass ribbon which is being conveyed.

At the inlet slot 61 of the second injector 60b, silane gas is blown from the first orifice 61a and oxygen gas is blown from the second and third orifices 61b and 61c. As a result, the silane gas and the oxygen gas are mixed and reacted with each other on the titanium oxide 14 layer of the glass ribbon to form a silicon oxide layer 16 on the surface of the titanium oxide layer 14 of the glass ribbon which is being conveyed.

At the inlet slot 61 of the third injector 60c, tin tetrachloride is blown from the first orifice 61a and water vapor is blown from the second and third orifices 61b and 61c. As a result, the tin tetrachloride and the water are mixed and reacted with each other on the silicon oxide layer 16 of the glass ribbon to form a first tin oxide layer 18, which has not been doped with fluorine, on the surface of the silicon oxide layer 16 of the glass ribbon that is being conveyed.

At the inlet slots 61 of the fourth to sixth injectors 60d to 60f, tin tetrachloride is blown from the first orifices 61a and water vapor and vaporized hydrogen fluoride are blown from the second and third orifices 61b and 61c. As a result, the tin tetrachloride, the water, and the hydrogen fluoride are mixed and reacted with each other on the first tin oxide layer 18 of the glass ribbon to form a second tin oxide layer 20, which has been doped with fluorine, on the surface of the first tin oxide layer 18 of the glass ribbon that is being conveyed.

The glass ribbon above which the second tin oxide layer 20 has been formed is discharged, while being conveyed, from the annealing furnace 54, cooled to around room temperature, cut into a desired size, and carried out as transparent conductive substrates 10 for solar cells.

It is preferred in the deposition in the annealing furnace that oxide materials such as titanium oxide, silicon oxide, and tin oxide should be deposited as described above. The atmosphere in the annealing furnace is air, because it is easy to supply oxygen molecules, e.g., oxygen gas, when oxides are formed.

Figure 4:
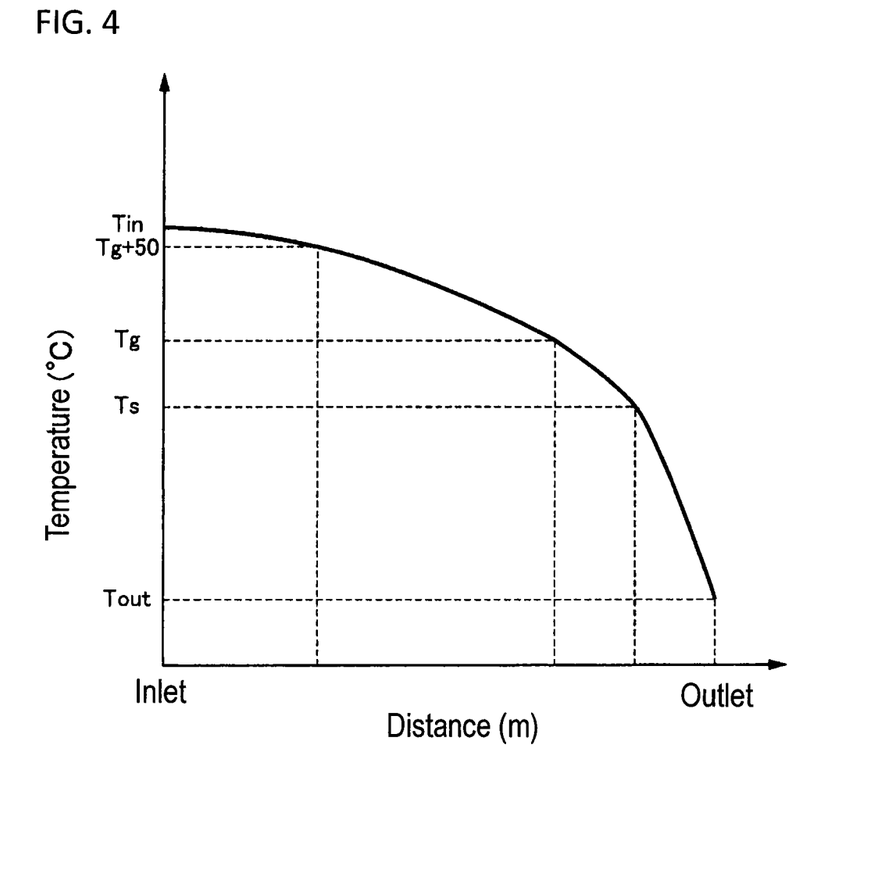
FIG. 4 is a graph which illustrates temperature control of a glass ribbon in an annealing furnace.

Here, the temperature control of the glass ribbon during deposition is explained while referring also to FIG. 4.

If the surface temperature of the glass ribbon at the time when the glass ribbon passes through the inlet of the annealing furnace 54 is expressed by Tin, the surface temperature of the glass ribbon at the time when the glass ribbon passes through the outlet of the annealing furnace 54 is expressed by Tout, the glass transition temperature is expressed by Tg, and the glass strain temperature is expressed by Ts, then the surface temperature of the glass ribbon on which deposition is to be performed is Tg+50° C. or lower but not lower than Ts. In the case where the glass ribbon has a surface temperature higher than Tg+50° C., this glass ribbon is prone to suffer "stamping flaws" or surface defects. In the case where the surface temperature thereof is lower than Ts, the raw-material gases undergo insufficient reaction due to heat.

The laminated film 13 described above which is composed of the titanium oxide layer 14, silicon oxide layer 16, first tin oxide layer 18, and second tin oxide layer 20 is formed at temperatures not higher than Tg+50° C. The laminated film 13 is formed preferably in the range of Tg+50° C. to Ts, more preferably in the temperature range of Tg+50° C. to Tg (or in the temperature range of Tin to Tg in the case where Tin is lower than Tg+50° C.).

In the case where the temperature of the glass ribbon declines to below Tg, there is a possibility that the glass ribbon might suffer considerable fluttering due to the contraction which accompanies a viscosity change of the glass. It is therefore preferred that all layers should be formed in the temperature range of Tg+50° C. to Tg. Thus, the fluttering of the glass ribbon can be inhibited regardless of the viscosity of the glass. In the case where deposition is conducted also in the temperature range of Tg to Ts, the number of layers to be formed in the temperature range of Tg to Ts is preferably 3 or less, more preferably 2 or less.

At temperatures not lower than Tg+50° C., the glass ribbon is soft and deposition on this glass ribbon is less apt to result in warpage or cracking of the glass ribbon.

The injectors 60 are kept at a temperature lower than that of the glass ribbon. Because of this, heat exchange with the injectors 60 occurs during the deposition to lower the temperature of the glass ribbon.

If the output speed of the glass ribbon is expressed by P (tons/day) and the specific heat of the glass is expressed by Cg (J/(kg·° C.)), then the quantity Qg (W) of heat which is removed from the glass until the temperature of the glass ribbon declines by 10° C. is determined using the following equation.

$$Qg(W) = P \times 1000/24/3600 \times Cg \times 10$$
$$= 0.116 \times P \times Cg$$

Here, the specific heat Cg of the glass is taken as Cg=1,000 J/(kg·° C.), and the following equation is satisfied.

$$Qg(kW)=0.116 \times P \qquad (1)$$

Namely, in the case where the glass ribbon is deprived of heat in a quantity not less than Qg=0.116×P (kW) during the period from the entrance thereof into the inlet Iin of the injector to the carrying-out thereof from the outlet Iout of the injector, this glass ribbon cracks.

Meanwhile, the radiant heat Q (W) transferred between the glass ribbon and the lower surface of the injector is calculated using the following radiation equation.

$$Q = S \times \epsilon \times F \times \sigma (T_{gla}^4 - T_{inj}^4) \qquad (2)$$

S is the surface area (m²) of the lower surface of the injector; $\epsilon$ is a radiation factor; F is a view factor in radiative heat transfer between the lower surface of the injector and the glass ribbon; $\sigma$ is Boltzmann's constant (5.67×10⁻⁸ (W/m²·K⁴)); $T_{gla}$ is the temperature (K) of the glass ribbon represented by $T_{gla}=(T_{in}+T_{out})/2$ using both a measured value $T_{in}$ obtained by measuring the temperature of the glass ribbon at the inlet of the injector by bringing thermocouple Type K into contact therewith and a measured value $T_{out}$ obtained by measuring the temperature of the glass ribbon at the outlet of the injector by bringing thermocouple Type K into contact therewith; and $T_{inj}$ is the temperature (K) of the lower surface of the injector.

Consequently, in order for the glass ribbon not to crack, the radiant heat Q (W) may be regulated so as to be not larger than the quantity Qg (W) of heat removed from the glass until the temperature of the glass ribbon declines by T° C. Hence, the following is derived from the equations (1) and (2).

$$S \times \epsilon \times F \times \sigma (T_{gla}^4 - T_{inj}^4) \leq 0.0116 \times P \times Cg \times T$$

Therefore, in order for the glass ribbon not to crack during the period when the glass ribbon passes from the inlet to the outlet of one injector, the following expression (3) may be satisfied.

$$S \leq (0.0116 \times P \times Cg \times T)/\{\epsilon \times F \times \sigma (T_{gla}^4 - T_{inj}^4)\} \qquad (3)$$

A specific explanation is given while referring to FIG. 2. In the lower surface 65 of the injector which faces the glass ribbon 70, the end thereof along the conveying direction of the glass ribbon 70 which is on the float bath 52 side is the inlet Iin of the injector, and the end thereof which is on the side opposite from the float bath 52 is the outlet Iout of the injector. The temperature by which the glass ribbon which has entered the inlet Iin of the injector is cooled until the glass ribbon is carried out through the outlet Iout of the injector is regulated to preferably 10° C. or less, more preferably 5° C. or less. In the case where the temperature by which the glass ribbon is cooled during conveyance from the inlet Iin to the outlet Iout of each injector is more than 10° C., the glass ribbon has an increased difference in temperature between the upper surface thereof and lower surface thereof. It is hence thought that the glass ribbon deforms considerably and scratches and cracks of the glass ribbon due to a contact between the injector and the glass ribbon are prone to result in warpage and cracks. Since the glass ribbon is cooled in the annealing furnace 54 to a temperature not higher than the Ts, it is preferred that the temperature by which the glass ribbon is cooled during conveyance from the inlet Iin of the injector to the outlet Iout of the injector in each of the injectors 60a to 60f should be 5° C. or more. So long as the temperature is 5° C. or more, the glass ribbon is cooled at a higher rate and the size of the annealing furnace can be shortened.

If the acceptable temperature drop T is actually set at 10° C. and the specific heat Cg of the glass is taken as Cg=1,000 J/(kg·° C.), the equation (1) is transformed as follows.

$$Qg(W)=116 \times P \qquad (1)'$$

Furthermore, if the radiation factor s is taken as 1, the view factor F is taken as 1, and on the assumption of the most upstream injector, the temperature of the glass ribbon is taken as 600° C., and the temperature of the lower surface of the injector is taken as 100° C., then the equation (2) is transformed as follows.

$$Q(W) = S \times 1 \times 1 \times 5.67 \times 10^{-8} \times \{(600 + 273.15)^4 - (100 + 273.15)^4\} \quad (2)'$$
$$= S \times 31857$$

Consequently, in order for the glass ribbon not to crack, the following expressions, which are derived from the equations (1)' and (2)', should be satisfied.

$$S \times 31857 \leq 116 \times P$$

$$S \leq P \times 0.0036$$

Therefore, by setting the area S of the lower surface of the injector so as to satisfy $S \leq P \times 0.0036$, the temperature by which the glass ribbon is cooled during conveyance from the inlet En of the injector to the outlet Iout of the injector can be regulated to 10° C. or less. It is preferred that the lower surface of the injector should have a rectangular shape; the longer sides thereof preferably have a dimension not shorter than the width of the approximate glass ribbon, and the dimension of the shorter sides thereof, i.e., the length of the lower surface of the injector in the conveying direction, is preferably 600 mm or less. The length of the injector along the conveying direction of the glass ribbon is preferably 600 mm or less, more preferably 500 mm or less. The shorter the length of the injector as measured along the conveying direction of the glass ribbon, the more the quantity of heat removed from the glass ribbon is reduced. However, since the raw-material gases injected from the lower surface of the injector flow through the space between the lower surface of the injector and the glass ribbon, an excessive reduction of the length of the injector in the conveying direction of the glass ribbon poses a problem that the duration when the raw-material gases move along the glass ribbon shortens and, hence, the duration of contact between the raw-material gases and the glass ribbon is shortened. It is therefore preferred that the lower limit thereof should be 100 mm or longer.

Here, the length of the lower surface of the injector in the carrying direction is the distance between the external sides of the exhaust slots 62 of the injector 60, i.e., the distance from the inlet Iin to the outlet Iout in the injector 60 in FIG. 2. The lengths of the inlet slot 61 and exhaust slots 62 are excluded. It is preferred that the output P of the glass ribbon should be 100 to 700 ton/day.

Furthermore, by setting the area S of the lower surface of each injector so as to satisfy $S \leq P \times 0.0018$, the temperature by which the glass ribbon is cooled during conveyance from the inlet Iin of the injector to the outlet Iout of the injector can be regulated to 5° C. or less.

Moreover, if the "temperature drop per unit length of the glass ribbon in a temperature range where the whole laminated film 13 is formed" is called K1 (hereinafter also referred to simply as temperature drop K1), K1 is set so that 0° C./m<K1<10° C./m, preferably 1° C./m≤K1≤5° C./m, more preferably 2° C./m≤K1≤3° C./m. The temperature drop K1 is a value obtained by dividing "the temperature difference between the temperature of the glass ribbon at the inlet of the first injector in the laminated film formation and the temperature of the glass ribbon at the outlet of the last injector" in the temperature range where the laminated film is formed by "the difference in distance between the position of the inlet of the first injector for the laminated film formation and the position of the outlet of the last injector". In the case where the temperature drop K1 is 10° C./m or larger, there is a possibility that the glass ribbon might warp or crack. In the case where the temperature drop K1 is 0° C./m, this means that the glass ribbon is not annealed in the annealing furnace 54 during the film deposition and is annealed after the deposition, resulting in the necessity of prolonging the annealing furnace 54.

In the case where the temperature drop K1 of the glass ribbon in the temperature range where the whole multilayer film 13 is formed does not satisfy 0° C./m<K1<10° C./m even though the temperature by which the glass ribbon is cooled during conveyance from the inlet Iin to the outlet Iout in each injector is 10° C. or less, it is possible to make the glass ribbon as a whole satisfy the temperature drop K1 by heating the glass ribbon with electric heaters 56 or the like disposed between the injectors 60 disposed adjacently along the conveying direction of the glass ribbon.

EXAMPLES

Examples of the present invention are explained below.

In the Examples explained below, temperature measurements were made with a contact type thermocouple (sensor; 213K1-TC1-ASP, manufactured by Anritsu Meter Co., Ltd.).

Example 1

In this Example, in the production of a soda-lime glass, six injectors 60a to 60f and electric heaters 56 were disposed in an annealing furnace, so that the electric heaters 56 were located between each of the injectors 60a to 60f, as shown in FIG. 2. A titanium oxide layer 14 was formed on the glass ribbon with the first injector 60a, a silicon oxide layer 16 was formed thereon with the second injector 60b, a first tin oxide layer 18 was formed thereon with the third injector 60c, and a second tin oxide layer 20 was formed thereon with the fourth to sixth injectors 60d to 60f, as shown in FIG. 3. Thereafter, the glass ribbon was cut to thereby form a substrate coated with a transparent conductive film 10 for solar cells. The gases introduced from each of the injectors 60a to 60f are as described above. The space between the lower surfaces of the injectors and the glass ribbon was regulated to 7 mm±1 mm. The six injectors were disposed at regular intervals of 2 m. The output P of the glass ribbon was 500 ton/day, and the area S of the lower surface of the injector was 1.76 m².

Use was made of a soda-lime glass having a glass transition temperature Tg of 560° C., a glass strain temperature Ts of 510° C., and a plate thickness of 3.2 to 3.9 mm. The temperature of the glass ribbon was determined by measuring the temperature of the upper surface of the glass ribbon with the contact type thermocouple Type K.

The temperature of the glass ribbon was measured before and after the injector. The distance between the measuring points was 2 m. The temperature of the glass ribbon surface which underlay the center of the injector was determined by a calculation. Since the main factor which contributes to the decrease of the temperature of the glass ribbon is cooling due to radiation to the injectors, the average of the temperatures measured before and after the injector was taken as the temperature of the glass ribbon surface underlying the center of the injector. The temperature measurement positions during the deposition of a transparent conductive film using the six injectors and the temperatures of the glass ribbon at the centers of the injectors are shown in Table 1.

TABLE 1

| Position | | Glass ribbon temperature | | Temperature change with |
|---|---|---|---|---|
| Distance (m) | Position name | Measured temperature (° C.) | Calculated value (° C.) | one injector (° C.) |
| 0 | Temperature measurement position 1 | 600 | | |
| | Position of injector 1 | | 595 | 10° C. |
| 2 | Temperature measurement position 2 | 590 | | |
| | Position of injector 2 | | 586 | 8° C. |
| 4 | Temperature measurement position 3 | 582 | | |
| | Position of injector 3 | | 578 | 8° C. |
| 6 | Temperature measurement position 4 | 574 | | |
| | Position of injector 4 | | 569.5 | 9° C. |
| 8 | Temperature measurement position 5 | 565 | | |
| | Position of injector 5 | | 561 | 8° C. |
| 10 | Temperature measurement position 6 | 557 | | |
| | Position of injector 6 | | 553.5 | 7° C. |
| 12 | Temperature measurement position 7 | 550 | | |

As apparent from Table 1, the temperature by which the glass ribbon was cooled during conveyance from the inlet to the outlet of each injector was 10° C. or less.

The temperature difference between the temperature at the inlet of the first injector and the temperature at the outlet of the last injector was determined from Table 1, and this temperature difference was divided by the difference in distance between the position of the inlet of the first injector and the position of the outlet of the last injector, i.e., 10.5 m. The thus-determined temperature drop K1 per unit length in the temperature range where all layers were formed is shown in Table 2.

TABLE 2

| | |
|---|---|
| Temperature drop K1 per unit length in the temperature range where all layers were formed | 4.8° C./m |

As shown in Table 2, the temperature drop K1 per unit length in the temperature range where all layers were formed was 4.8° C./m.

The calculative area S (m$^2$) of each injector which is determined using $(0.0116 \times P \times Cg \times T)/\{\epsilon \times F \times \sigma(T_{gla}^4 - T_{inj}^4)\}$ is shown in Table 3. When the calculation was made, the following values were set: Cg=1,000 J/(kg·° C.); radiation factor $\epsilon$=1; view factor F=1; Boltzmann's constant $\sigma$=5.67× 10$^{-8}$ (W/m$^2$·K$^4$) acceptable temperature drop T=10° C.; and temperature of the lower surface of the injector $T_{inj}$=100° C.

TABLE 3

| | Calculative area |
|---|---|
| INJ-1 | 1.86 |
| INJ-2 | 1.95 |
| INJ-3 | 2.02 |
| INJ-4 | 2.02 |
| INJ-5 | 2.20 |
| INJ-6 | 2.29 |

It can be seen from Table 3 that the area of the facing surface of the injector that was determined through the calculation was larger than 1.76 m$^2$, which was the actual area of the facing surface, and $S \leq (0.0116 \times P \times Cg \times T)/\{\epsilon \times F \times \sigma(T_{gla}^4 - T_{inj}^4)\}$ was measured.

After having been cooled, the glass ribbon was cut into a desired size to thereby obtain a transparent conductive film-coated substrate for solar cells. The thus-produced transparent conductive substrate for solar cells had not suffered the trouble that a contact between the injector and the glass ribbon caused scratches and cracks to the glass ribbon.

Example 2

Deposition was conducted using six injectors while cooling a soda-lime glass in an annealing furnace in the same manner as in Example 1, except that the output and plate thickness of the glass ribbon, and conditions for heating with the heaters were changed. The soda-lime glass used here had a Tg of 560° C. and a Ts of 510° C. The output P of the glass ribbon was 640 tons/day, the plate thickness was 2.2 mm, and the area S of the lower surface of the injector was 1.76 m$^2$.

As in Example 2, the temperature measurement positions during the deposition of a transparent conductive film using the six injectors and the temperatures of the glass ribbon at the centers of the injectors are shown in Table 4.

TABLE 4

| Position | | Glass ribbon temperature | | Temperature change with |
|---|---|---|---|---|
| Distance (m) | Position name | Measured temperature (° C.) | Calculated value (° C.) | one injector (° C.) |
| 0 | Temperature measurement position 1 | 577 | | |
| | Position of injector 1 | | 573.5 | 7° C. |
| 2 | Temperature measurement position 2 | 570 | | |
| | Position of injector 2 | | 567 | 6° C. |
| 4 | Temperature measurement position 3 | 564 | | |
| | Position of injector 3 | | 561 | 6° C. |
| 6 | Temperature measurement position 4 | 558 | | |
| | Position of injector 4 | | 555 | 6° C. |
| 8 | Temperature measurement position 5 | 552 | | |
| | Position of injector 5 | | 549 | 6° C. |

TABLE 4-continued

| Position | | Glass ribbon temperature | | Temperature change with one injector (° C.) |
|---|---|---|---|---|
| Distance (m) | Position name | Measured temperature (° C.) | Calculated value (° C.) | |
| 10 | Temperature measurement position 6 | 546 | | |
| | Position of injector 6 | | 543.5 | 5° C. |
| 12 | Temperature measurement position 7 | 541 | | |

As apparent from Table 4, the temperature by which the glass ribbon was cooled during conveyance from the inlet to the outlet of each injector was 10° C. or less.

The temperature difference between the temperature at the inlet of the first injector and the temperature at the outlet of the last injector was determined from Table 4, and this temperature difference was divided by the difference in distance between the position of the inlet of the first injector and the position of the outlet of the last injector, i.e., 10.5 m. The thus-determined temperature drop K1 per unit length in the temperature range where all layers were formed is shown in Table 5.

TABLE 5

| Temperature drop K1 per unit length in the temperature range where all layers were formed | 3.4° C./m |
|---|---|

As shown in Table 5, the temperature drop K1 per unit length in the temperature range where all layers were formed was 3.4° C./m.

The calculative area S (m$^2$) of each injector which is determined using $(0.0116 \times P \times Cg \times T)/\{\epsilon \times F \times \sigma(T_{gla}^4 - T_{inj}^4)\}$ is shown in Table 6. When the calculation was made, the following values were set: Cg=1,000 J/(kg·° C.); radiation factor $\epsilon$=1; view factor F=1; Boltzmann's constant $\sigma$=5.67× 10$^{-8}$ (W/m$^2$·K$^4$); acceptable temperature drop T=10° C.; and temperature of the lower surface of the injector $T_{inj}$=100° C.

TABLE 6

| | Calculative area |
|---|---|
| INJ-1 | 2.07 |
| INJ-2 | 2.14 |
| INJ-3 | 2.20 |
| INJ-4 | 2.27 |
| INJ-5 | 2.34 |
| INJ-6 | 2.40 |

It can be seen from Table 6 that the area of the facing surface of the injector that was determined through the calculation was larger than 1.76 m$^2$, which was the actual area of the facing surface, and $S \leq (0.0116 \times P \times Cg \times T)/\{\epsilon \times F \times \sigma(T_{gla}^4 - T_{inj}^4)\}$ was satisfied.

After having been cooled, the glass ribbon was cut into a desired size to thereby obtain a transparent conductive film-coated substrate for solar cells. In also the thus-produced transparent conductive substrate for solar cells, the deposition with six injectors in the annealing furnace was able to be carried out without causing the problem that a contact between the injector and the glass ribbon caused scratches and cracks to the glass ribbon.

Reference Examples

Furthermore, when a transparent conductive film for solar cells was deposited in the production process of the present invention, the temperature of the lower surface of the glass ribbon was measured at each of the positions where the temperatures of the upper surface of the glass ribbon were 590° C., 560° C., and 550° C.

Temperature of the lower surface of the glass ribbon at the position where the temperature of the upper surface was 590° C.: 580° C.

Temperature of the lower surface of the glass ribbon at the position where the temperature of the upper surface was 560° C.: 560° C.

Temperature of the lower surface of the glass ribbon at the position where the temperature of the upper surface was 550° C.: 550° C.

The temperature differences in the thickness direction of the glass ribbon were 10° C. or less.

It can be seen from the results that in the production process of the present invention, the glass ribbon has a narrow temperature distribution in the thickness direction, and it is presumed that the glass ribbon warps little.

As explained above, according to the method for manufacturing the glass substrate shown as the present embodiments, the glass substrate can be inhibited from warping or cracking, when a laminated film is formed on the glass ribbon in the annealing furnace by an on-line CVD method, by setting the area S (m$^2$) of the facing surface of each injector, which faces the glass ribbon so as to satisfy $S \leq (0.0116 \times P \times Cg \times T)/\{\epsilon \times F \times \sigma(T_{gla}^4 - T_{inj}^4)\}$ wherein P is the output (ton/day) of the glass ribbon, Cg is the specific heat (J/(kg·° C.)) of the glass, T is an acceptable temperature drop (° C.) by which the glass ribbon is cooled during conveyance from the inlet to the outlet of one injector, $\epsilon$ is radiation factor, F is surface-to-surface view factor, $\sigma$ is Boltzmann's constant (5.67×10$^{-8}$ (W/m$^2$·K$^4$)), $T_{gla}$ is the temperature (K) of the glass ribbon represented by $K=(T_{in}+T_{out})/2$ using both of a measured value $T_{in}$ obtained by measuring the temperature of the glass ribbon at the inlet of the injector by bringing thermocouple Type K into contact therewith and a measured value $T_{out}$ obtained by measuring the temperature of the glass ribbon at the outlet of the injector by bringing thermocouple Type K into contact therewith, and $T_{inj}$ is the temperature (K) of the facing surface of the injector. Furthermore, it is possible to regulate the output of the glass ribbon in relation to the area of the injector on the basis of the above relationship.

The present invention is not limited to the above-described embodiments, and will be carried out with various modifications without departing from the spirit and scope thereof.

For example, although the electric heaters are exemplified as a heater, any heating means can be used without limiting thereto.

This application is based on Japanese Patent Application No. 2011-154316 filed on Jul. 12, 2011, the entire subject matters of which are incorporated herein by reference.

DESCRIPTION OF REFERENCE NUMERALS

10 Transparent conductive substrate for solar cell
13 Laminated film
50 Glass manufacturing apparatus
51 Melting furnace
52 Float bath 54 Annealing furnace
56 Electric heater
60 Injector
70 Glass ribbon

The invention claimed is:

1. A method for manufacturing a laminated film-coated glass plate, the method comprising:
melting a raw material for a glass to obtain a molten glass;
floating the molten glass on a molten metal to form a glass ribbon;
annealing the glass ribbon in an annealing furnace;
depositing a laminated film on an upper surface of the glass ribbon by a CVD method using injectors disposed in the annealing furnace; and
cutting the glass ribbon to obtain the film-coated glass plate, wherein:
a temperature of the upper surface of the glass ribbon while the laminated film is deposited thereon is Tg+50° C. or lower, wherein Tg is a glass transition temperature of the glass; and
a facing surface of each injector which faces the glass ribbon has an area S (m$^2$) represented by the following expression:

$$S \leq (0.0116 \times P \times Cg \times T)/\{\epsilon \times F \times \sigma(T_{gla}^4 - T_{inj}^4)\},$$

wherein P is an output speed (ton/day) of the glass ribbon; Cg is a specific heat (J/(kg·° C.)) of the glass; T is an acceptable temperature drop by which the glass ribbon is cooled during conveyance from an inlet to an outlet in one injector, which is less than or equal to 10° C.; $\epsilon$ is a radiation factor; F is a view factor in radiative heat transfer between the facing surface of the injector and the glass ribbon; $\sigma$ is Boltzmann's constant ($5.67 \times 10^{-8}$ (W/m$^2$·K$^4$)); $T_{gla}$ is a temperature (K) of the glass ribbon represented by $T_{gla} = (T_{in} + T_{out})/2$, wherein $T_{in}$ is a temperature (K) of the glass ribbon at a beginning of a deposition by the injector measured by a Type K thermocouple, and $T_{out}$ is a temperature of the glass ribbon at an end of the deposition by the injector measured by a Type K thermocouple; and $T_{inj}$ is a temperature (K) of the facing surface of the injector.

2. The method according to claim 1, wherein a distance between the facing surface of each injector and the glass ribbon is 30 mm or less.

3. The method according to claim 2, wherein a heater is disposed between the injectors disposed adjacently along a conveying direction of the glass ribbon.

4. The method according to claim 1, wherein a heater is disposed between the injectors disposed adjacently along a conveying direction of the glass ribbon.

5. The method according to claim 1, wherein the number of the injectors is in a range of 2 to 9.

6. The method according to claim 1, wherein the temperature of the facing surface of each injector is in a range of 100 to 250° C.

7. The method according to claim 1, wherein the temperature of the upper surface of the glass ribbon while the laminated film is deposited thereon is not lower than Ts, wherein the Ts is a glass strain temperature of the glass.

8. The method according to claim 1, wherein the temperature of the upper surface of the glass ribbon while the laminated film is deposited thereon is not lower than Tg.

9. The method according to claim 1, wherein T is 5(° C.).

10. The method according to claim 1, wherein the facing surface of each injector has an area S (m$^2$) represented by the following expression:

$$S \leq P \times 0.0036.$$

11. The method according to claim 1, wherein a length of each injector along a conveying direction of the glass ribbon is 600 mm or less.

12. The method according to claim 1, wherein a length of each injector along a conveying direction of the glass ribbon is 500 mm or less.

13. The method according to claim 11, wherein a length of each injector along a conveying direction of the glass ribbon is 100 mm or more.

14. The method according to claim 12, wherein a length of each injector along a conveying direction of the glass ribbon is 100 mm or more.

15. The method according to claim 1, wherein an average temperature drop of the upper surface of the glass ribbon while the laminated film is deposited is more than 0° C./m and less than 10° C./m.

16. The method according to claim 1, wherein an average temperature drop of the upper surface of the glass ribbon while the laminated film is deposited is in a range of 1 to 5° C./m.

17. The method according to claim 1, wherein an average temperature drop of the upper surface of the glass ribbon while the laminated film is deposited is in a range of 2 to 3° C./m.

18. The method according to claim 1, wherein the glass is a soda-lime glass, and the temperature of the upper surface of the glass ribbon while the laminated film is deposited thereon is 610° C. or lower.

19. The method according to claim 1, wherein the glass is a soda-lime glass, and the temperature of the upper surface of the glass ribbon while the laminated film is deposited thereon is in a range of 560 to 610° C.

* * * * *